United States Patent [19]

Lee

[11] Patent Number: 5,659,352

[45] Date of Patent: Aug. 19, 1997

[54] METHOD AND APPARATUS CAPABLE OF REDUCING THE TUNING TIME OF CABLE TELEVISION SIGNALS

[75] Inventor: Mi-Hwa Lee, Seoul, Rep. of Korea

[73] Assignee: Daewoo Electronics Co., Ltd., Seoul, Rep. of Korea

[21] Appl. No.: 580,903

[22] Filed: Dec. 27, 1995

[30] Foreign Application Priority Data

Dec. 27, 1994 [KR] Rep. of Korea .............. 94-37253

[51] Int. Cl.⁶ .................................................. H04N 7/16
[52] U.S. Cl. .................................. 348/10; 348/731; 455/6.2
[58] Field of Search ............................. 348/10, 11, 12, 348/13, 6, 7, 731, 732, 733, 734, 735; 455/6.2, 6.3, 6.1, 5.1; H04N 7/16, 7/173, 5/50

[56] References Cited

U.S. PATENT DOCUMENTS

| | | | |
|---|---|---|---|
| 4,677,685 | 6/1987 | Kurisu | 455/4 |
| 5,087,977 | 2/1992 | Suizu | 358/193.1 |
| 5,245,437 | 9/1993 | Na | 358/191.1 |
| 5,329,364 | 7/1994 | Lee | 348/11 |
| 5,508,762 | 4/1996 | Lee | 348/734 |
| 5,594,510 | 1/1997 | Sakakibara | 348/731 |

FOREIGN PATENT DOCUMENTS 6205314  7/1994  Japan ................. H04N 5/44

*Primary Examiner*—John K. Peng
*Assistant Examiner*—Chris Grant
*Attorney, Agent, or Firm*—Pennie & Edmonds LLP

[57] ABSTRACT

A novel cable television (CATV) signal tuning method, which is capable of reducing the time taken to tune CATV signals transmitted via a cable, comprises (a) determining, in response to a mode determination signal, one of harmonical related carriers (HRC), interval related carrier (IRC) and standard (STD) transmission modes as a definitive transmission mode for a plurality of channels, to thereby produce mode information of the definitive transmission mode; (b) storing the mode information; and (c) fine-tuning, in response to a channel selection signal, a CATV signal from a selected channel based on the definitive transmission mode represented by the stored mode information.

6 Claims, 2 Drawing Sheets

METHOD AND APPARATUS CAPABLE OF REDUCING THE TUNING TIME OF CABLE TELEVISION SIGNALS

FIELD OF THE INVENTION

The present invention relates to a method and an apparatus for tuning cable television (CATV) signals; and, more particularly, to a method and an apparatus, for use in a CATV receiver, for reducing the time taken to tune the CATV signals received by the CATV receiver.

BACKGROUND OF THE INVENTION

A conventional CATV broadcasting system is known to provide various types of information over a plurality of channels to its subscribers. The CATV signals from the plurality of channels are processed and transmitted through one of several known transmission modes, e.g., standard (STD), harmonical related carriers (HRC) and interval related carriers (IRC) transmission modes, especially in the North America.

In such a CATV broadcasting system, in order to efficiently modulate and transmit the CATV signals, various carrier or modulation frequencies are assigned to these transmission modes. In the HRC transmission mode, for instance, the modulation frequencies of all channels except the channels of, e.g., 5 and 6, have, e.g., 1.2 MHz frequency offsets lower than those of the STD transmission mode; and the modulation frequencies of channels 5 and 6 are, e.g., 0.75 MHz higher than those of the STD transmission mode. In the IRC transmission mode, on the other hand, the modulation frequencies of all channels except channels of, e.g., 5 and 6, are identical to those of the STD transmission mode; and the modulation frequencies of channels 5 and 6 are, e.g., 2 MHz higher than those for the STD transmission mode.

The CATV signals for the plurality of channels are modulated at a transmitter based on one of the three transmission modes. At the CATV receiver, one of the modulated CATV signals is selected and processed by employing a conventional CATV signal reconstruction technique to provide a reconstructed CATV signal to a next processor, e.g., a display unit, for the display thereof.

The quality of the reconstructed CATV signal may depend on an automatic fine tuning (AFT) technique employed to tune the modulated CATV signal from a selected channel. Consequently, to reduce the amount of time needed to tune the modulated CATV signal and enhance the quality thereof, there have been proposed various AFT techniques.

One of such techniques is disclosed in U.S. Pat. No. 5,329,364, issued to Nam H. Lee, entitled "METHOD FOR REDUCING HRC MODE RECEPTION TIME IN CABLE TELEVISION". In the disclosed method for reducing the tuning time of a CATV signal transmitted in the HRC transmission mode, it is assumed first that the CATV signal from a selected channel has been transmitted in the STD mode; and then, it is checked whether a synchronization (SYNC) signal is detected at a STD mode modulation frequency for that channel. If the SYNC signal is detected, then it is determined that the CATV signal from the selected channel has been transmitted in the STD transmission mode; and, otherwise, it is assumed that the broadcasting has been made in the HRC transmission mode. Finally, a series of fine tuning processes for the selected channel is carried out with respect to the modulation frequency of the determined mode for that channel to thereby provide a fine tuned CATV signal of the selected channel.

However, the prior art CATV signal tuning technique determines the transmission mode for a CATV signal from a selected channel at each time of selecting the channel, resulting in a prolonged processing time.

SUMMARY OF THE INVENTION

It is, therefore, a primary object of the present invention to provide a method and an apparatus, for use in a CATV receiver, which is capable of substantially reducing the time taken to tune the CATV signals received by the CATV receiver employing an effective CATV signal tuning technique.

In accordance with one aspect of the invention, there is provided an improved method, for use in a CATV receiver, for tuning CATV signals from a plurality of channels coupled to the CATV receiver, wherein the CATV signals have been modulated and transmitted in one of STD, HRC and IRC transmission modes, and the CATV receiver includes means for generating a mode determination signal and means for providing a channel selection signal, said method comprising the steps of:

(a) determining, in response to the mode determination signal, one of the HRC, IRC and STD transmission modes as a definitive transmission mode for the plurality of channels, to thereby produce mode information of the definitive transmission mode;

(b) storing the mode information; and (c) fine tuning, in response to the channel selection signal, a CATV signal from a selected channel based on the definitive transmission mode represented by the stored mode information.

In accordance with another aspect of the invention, there is provided an improved apparatus, for use in a CATV receiver, for tuning CATV signals from a plurality of channels coupled to the CATV receiver, wherein the CATV signals have been modulated and transmitted in one of STD, HRC and IRC transmission modes, and the CATV receiver includes means for generating a mode determination signal and means for providing a channel selection signal, which comprises:

means for determining, in response to the mode determination signal, one of the HRC, IRC and STD transmission modes as a definitive transmission mode for the plurality of channels, to thereby produce mode information of the definitive transmission mode;

means for storing the mode information; and means for fine tuning, in response to the channel selection signal, a CATV signal from a selected channel based on the definitive transmission mode represented by the stored mode information.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Figure 1:
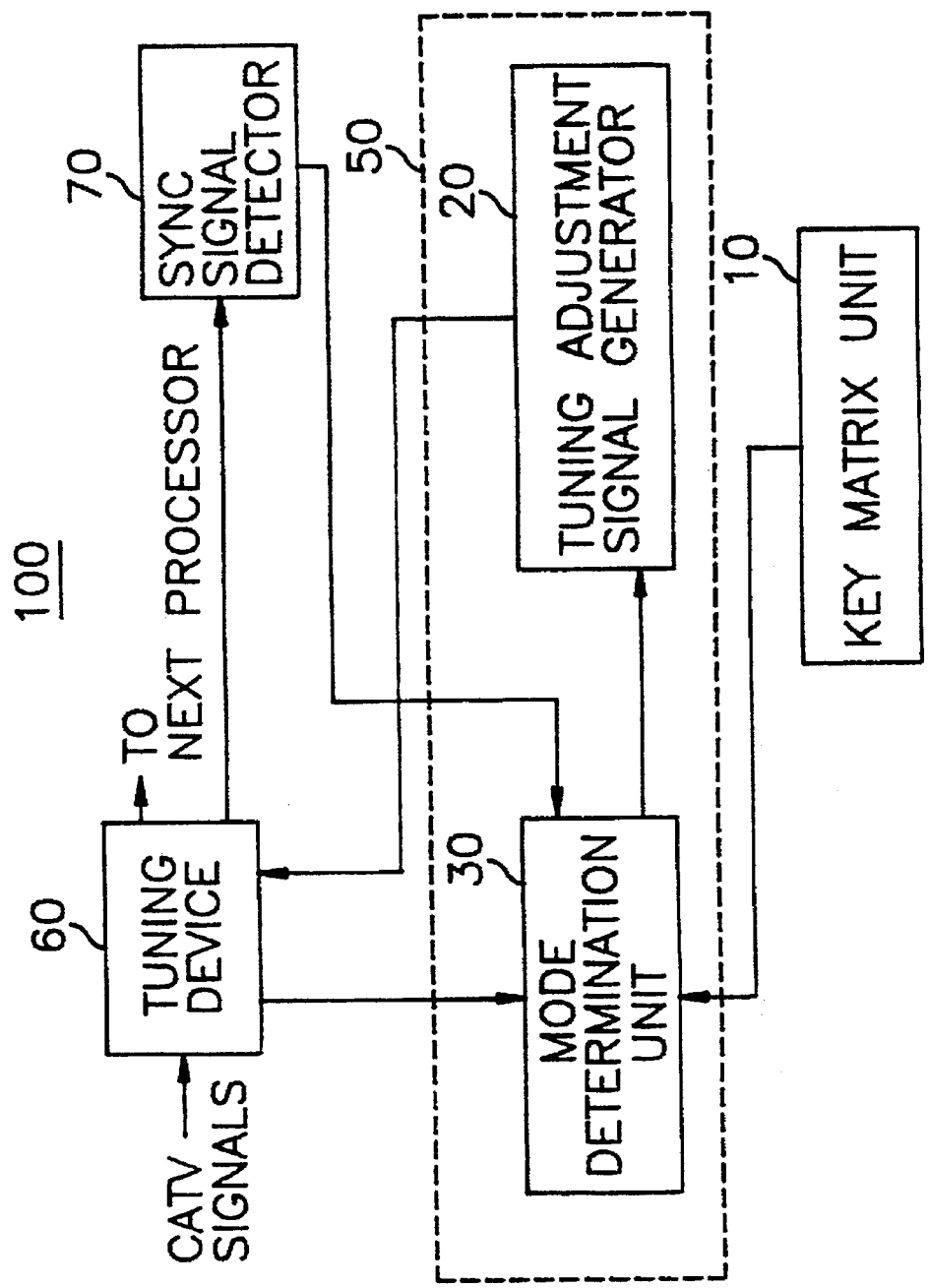
FIG. 1 is a block diagram illustrating a CATV signal tuning apparatus in accordance with the present invention.

Referring to FIG. 1, there is shown a block diagram of a novel CATV signal tuning apparatus 100 of the invention for use in a CATV receiver. The CATV receiver is capable of receiving CATV signals from a plurality of channels transmitted through a cable from a CATV broadcasting system, wherein the CATV signals have been modulated and transmitted in one of three, i.e., STD, HRC and IRC, transmission modes. The inventive CATV signal tuning apparatus 100 comprises a key matrix unit 10, a tuning control device 50, a tuning device 60 and a SYNC signal detector 70.

The key matrix unit 10 includes a multiplicity of numeric keys, and a mode determination key (not shown). The mode determination key serves to generate a mode determination signal when it is pressed, which is then provided to the tuning control device 50. It should be noted that a remote control unit may be employed instead of the key matrix unit 10.

At the tuning control device 50 including a tuning adjustment signal generator 20 and a mode determination unit 30, the transmission mode of the CATV signals from the plurality of channels is determined by using a CATV signal tuning scheme in accordance with the invention.

Figure 2:
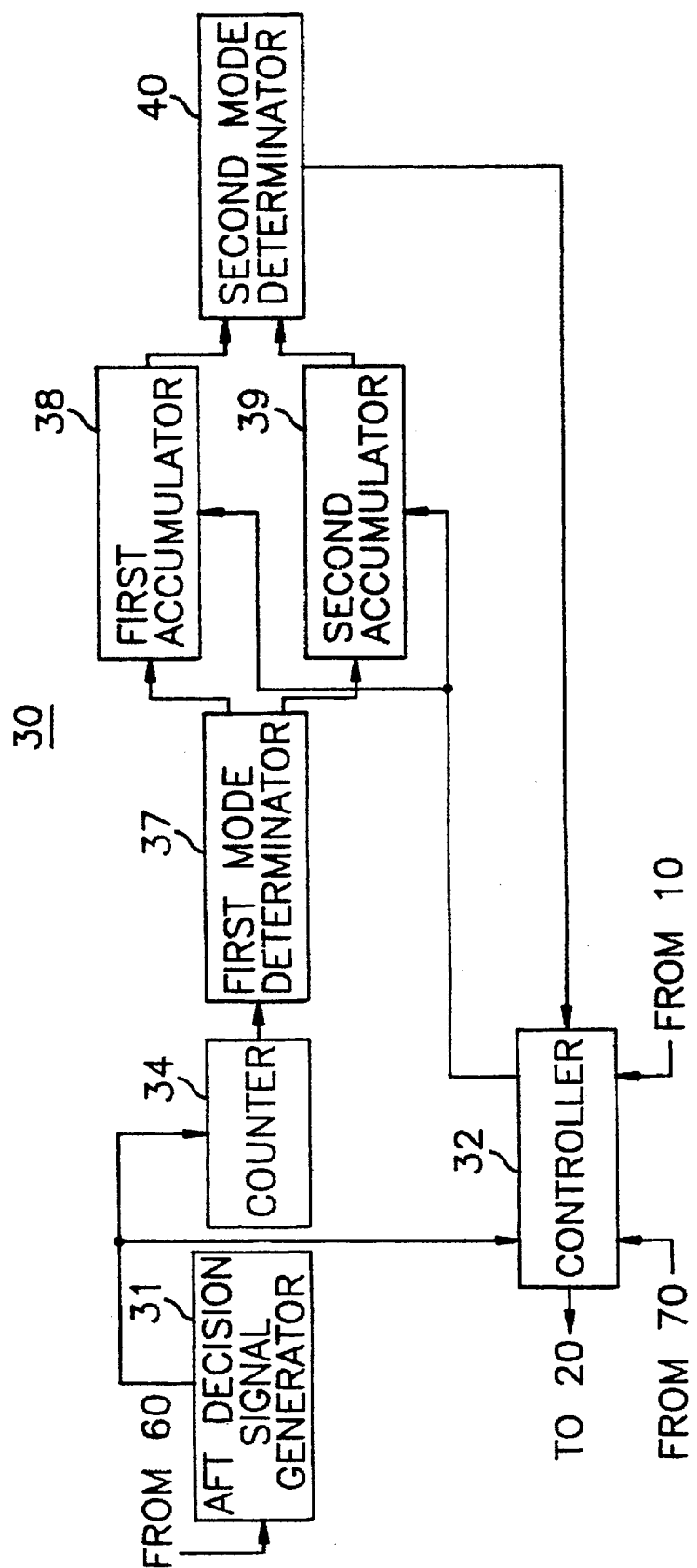
FIG. 2 presents a detailed block diagram of the mode determination unit shown in FIG. 1.

With reference to FIGS. 1 and 2, the CATV signal tuning scheme will now be described. Specifically, in response to the mode determination signal from the key matrix unit 10, a controller 32 included in the mode determination unit 30 performs a SYNC signal detection process by providing the tuning adjustment signal generator 20 with a first control signal CS1 for sequentially producing S number, e.g., 9, of SYNC detection reference signals for a first channel, e.g., channel 2, wherein S is a positive integer. The nine SYNC detection reference signals, SD2(0) to SD2(4) and SD2(−1) to SD2(−4), for the channel 2 are phase locked loop (PLL) signals which correspond to nine modulation frequencies, $f2_o$, $(f2_o+0.5$ MHz), $(f2_o+1$ MHz), $(f2_o+1.5$ MHz), $(f2_o+2$ MHz), $(f2_o-0.5$ MHz), $(f2_o-1$ MHz), $(f2_o-1.5$ MHz) and $(f2_o-2$ MHz), wherein $f2_o$ is the modulation frequency of the STD transmission mode for channel 2. Thereafter, each of the nine SYNC detection reference signals, SD2(0) to SD2(4) and SD2(−1) to SD2(−4), is sequentially supplied to the tuning device 60.

The tuning device 60, in response to each of the SYNC detection reference signals, tunes CATV signals inputted thereto to a modulation frequency which corresponds to each of the SYNC detection reference signals and provides a tuned signal to the SYNC signal detector 70. The SYNC signal detector 70 detects a SYNC signal from the tuned signals by employing a conventional SYNC signal detection technique well known in the art; and provides the controller 32 with, e.g., a logic high SYNC detection signal to if a SYNC signal is detected from any of the tuned signals and a logic low SYNC detection signal, if otherwise.

At the controller 32, it is determined whether a CATV signal is being broadcast in response to the SYNC signal detection signal. That is, if the logic low SYNC detection signal is applied thereto, it is assumed that no CATV signal is being broadcast on the channel; and the SYNC signal detection process described above is repeated for a next channel. However, if the logic high SYNC detection signal is provided from the SYNC signal detector 70, which implies that a CATV signal is being broadcast on the channel, the controller 32 proceeds to a mode detection process on the channel.

In order to detect a transmission mode for the CATV signal on the channel, the controller 32 provides the tuning adjustment signal generator 20 with a second control signal CS2 for sequentially generating to the tuning device 60 P number, e.g., 65, of tuning adjustment signals, TAS2(0) to TAS2(32) and TAS2(−1) to TAS2(−32), wherein P is a positive integer. The sixty-five tuning adjustment signals, TAS2(0) to TAS2(32) and TAS2(−1) to TAS2(−32), represent PLL signals corresponding to sixty-five modulation frequencies, $f2_o$ to $(f2_o+2$ MHz) and $(f2_o-62.5$ KHz) to $(f2_o-2$ MHz), which have been derived by sequentially increasing and decreasing the channel 2 modulation frequency, $(f2_o)$, of the STD mode by a predetermined frequency step, e.g., 62.5 KHz, within a predetermined frequency bandwidth ranging between $(f2_o-2$ MHz) and $(f2_o+2$ MHz).

The tuning device 60, in response to a tuning adjustment signal sequentially provided from the tuning adjustment signal generator 20, starting from TAS2(0) to TAS2(32) and then from TAS2(−1) to TAS2(−32), tunes the CATV signal on the channel to a modulation frequency which corresponds to the tuning adjustment signal to thereby generate an AFT signal therefor, wherein the AFT signal is represented by a voltage signal indicating a quality level of the tuned signal. The AFT voltage is then provided to a AFT decision signal generator 31.

Each of the AFT voltages sequentially provided from the tuning device 60 is received by the AFT decision signal generator 31, which checks if the AFT voltage is within a predetermined voltage range, and then outputs a logic high AFT decision signal when the AFT voltage lies within the voltage range, indicating the CATV signal from the channel is properly tuned; and, otherwise, outputs a logic low AFT decision signal. Subsequently, each of the AFT decision signals produced at the AFT decision signal generator 31 is sequentially fed to a counter 34 and the controller 32.

The counter 34 counts the number of sequentially provided logic low AFT decision signals up to maximum 33 (which corresponds to TAS2(0)–TAS2(32)) and resets, if the number reaches 33, the counted value to zero, thereby resuming the counting of the number of sequentially provided logic low AFT decision signals from −1 to −32 (which corresponds to TAS2(−1)–TAS2(−32)); and outputs the counted value to a first mode determinator 37 and resets the counted value to zero. In a preferred embodiment of the present invention, the first mode determinator 37 determines a transmission mode for the CATV signal from the channel as the IRC transmission mode if the counted value from the counter 34 is equal to or larger than a first predetermined threshold value, TH1, e.g., 20; and, as the HRC transmission mode if the counted value is equal to or smaller than a second predetermined threshold value TH2, e.g., −10, wherein TH1 and TH2 are integers satisfying the relationship of TH1>|TH2|.

After determining the transmission mode for the CATV signal from the channel, mode information which corresponds to the determined transmission mode is supplied to one of the first and the second accumulators 38 and 39 wherein the number of the corresponding mode applied thereto is counted and stored therein as a counted number of respective modes. In a preferred embodiment of the invention, for example, if the CATV signal from a channel is determined to be the IRC transmission mode, information thereof is fed to the first accumulator 38; and, if the HRC transmission mode, information thereof is supplied to the second accumulator 39.

In the meantime, if the logic high AFT decision signal is fed from the AFT decision signal generator 31, the controller 32 carries out the SYNC signal detection process described above for a next channel; and, in this manner, the process is repeated for all the remaining channels. If the determination of the transmission modes for all the channels has been completed, the controller 32 issues a completion signal to the accumulators 38 and 39, respectively, wherein the counted numbers of the IRC and HRC modes stored in the accumulators 38 and 39 are retrieved to a second mode determinator 40, respectively, and then reset to zeros.

The second mode determinator 40 serves to determine the definitive transmission mode for the CATV signals from all of the channels based on the counted numbers of the IRC and HRC modes to thereby produce mode information for the determined definitive transmission mode. More specifically, the IRC transmission mode is determined as the definitive transmission mode for the CATV signals from all the channels if the counted number of IRC modes from the first accumulator 38 is equal to or larger than a third predetermined threshold value, TH3, e.g., 1; and the HRC transmission mode as the definitive transmission mode if the counted number of HRC modes from the second accumulator 39 is equal to or larger than a fourth predetermined threshold value, TH4, e.g., 5; and, the STD transmission mode as the definitive transmission mode if otherwise, wherein TH3 and TH4 are integers satisfying the relationship of TH3<TH4.

Subsequently, the mode information for the determined definitive transmission mode produced at the second mode determinator 40 is provided to a memory (not shown) of the controller 32 for the storage thereof. Once the mode information is stored in the memory, it is not changed or cleared unless the mode determination key of the key matrix unit 10 shown in FIG. 1 is reactivated.

Once the definitive transmission mode for all the channels is determined, the controller 32 can promptly provide, in response to a channel selection signal from the key matrix unit 10, the tuning adjustment signal generator 20 with a control signal for enabling the generator 20 to produce a tuning decision signal, TDS, wherein the tuning decision signal, TDS, is a PLL signal corresponding to a modulation frequency of the selected channel having the determined definitive transmission mode. And then, the tuning decision signal, TDS, so produced is provided to the tuning device 60.

In response to the tuning decision signal, TDS, the tuning device 60 fine tunes the CATV signal from the selected channel with respect to the modulation frequency corresponding thereto by employing a conventional fine-tuning scheme, thereby providing a fine-tuned CATV signal to a next processor, e.g., CATV signal processor (not shown) for the reconstruction thereof.

As shown above, therefore, the present invention is capable of substantially reducing the time taken to tune a CATV signal from a selected channel through the use of the effective CATV signal tuning technique of the present invention.

While the present invention has been shown and described with respect to the particular embodiment, it will be apparent to those skilled in the art that many changes and modifications may be made without departing from the spirit and scope of the invention as defined in the appended claims.

What is claimed is:

1. An improved method, for use in a cable television (CATV) receiver, for tuning CATV signals from a plurality of channels coupled to the CATV receiver, wherein the CATV signals have been modulated and transmitted in one of standard (STD), harmonical related carriers (HRC) and interval related carriers (IRC) transmission modes, and the CATV receiver includes means for generating a mode determination signal and means for providing a channel selection signal, said method comprising the steps of:

(a) determining, in response to the mode determination signal, one of the HRC, IRC and STD transmission modes as a definitive transmission mode for the plurality of channels, to thereby produce mode information of the definitive transmission mode;

(b) storing the mode information; and (c) fine-tuning, in response to the channel selection signal, a CATV signal from a selected channel based on the definitive transmission mode represented by the stored mode information.

2. The method of claim 1, wherein said step (a) of determining the definitive transmission mode includes the steps of:

(a1) tuning a channel to provide a tuned frequency thereof;

(a2) estimating a transmission mode for the channel based on the tuned frequency;

(a3) repeating said steps (a1) and (a2) for all the remaining channels; and (a4) determining the definitive transmission mode for the plurality of channels based on the transmission modes estimated in said step (a2).

3. The method of claim 2, wherein the definitive transmission mode is determined as the IRC transmission mode if the transmission modes estimated in said step (a2) includes one or more IRC transmission modes; as the HRC transmission mode if the transmission modes estimated in said step (a2) includes no IRC transmission mode but more than four HRC transmission modes; and the STD transmission mode, if otherwise.

4. An improved apparatus, for use in a CATV receiver, for tuning CATV signals from a plurality of channels coupled to the CATV receiver, wherein the CATV signals have been modulated and transmitted in one of STD, HRC and IRC transmission modes, and the CATV receiver includes means for generating a mode determination signal and means for providing a channel selection signal, which comprises:

means for determining, in response to the mode determination signal, one of the HRC, IRC and STD transmission modes as a definitive transmission mode for the plurality of channels, to thereby produce mode information of the definitive transmission mode;

means for storing the mode information; and means for fine-tuning, in response to the channel selection signal, a CATV signal from a selected channel based on the definitive transmission mode represented by the stored mode information.

5. The apparatus of claim 4, wherein said means of determining the definitive transmission mode includes:

means for tuning a target channel of the plurality of channels to provide a tuned frequency thereof, wherein the target channel represents a channel to be processed;

means for estimating a transmission mode for the target channel based on the tuned frequency to produce mode information of the transmission mode;

means for storing the mode information for the target channel;

means for retrieving the stored mode information when transmission modes for the plurality of channels have been estimated and stored in the storage means; and means for determining the definitive transmission mode for the plurality of channels based on the estimated transmission modes represented by the retrieved mode information.

6. The apparatus of claim 5, wherein the definitive transmission mode is determined as the IRC transmission mode if the estimated transmission modes includes one or more IRC transmission modes; as the HRC transmission mode if the estimated transmission modes includes no IRC transmission mode but more than four HRC transmission modes; and the STD transmission mode, if otherwise.

* * * * *